(12) United States Patent
Choi (10) Patent No.: US 7,344,992 B2
(45) Date of Patent: Mar. 18, 2008

(54) METHOD FOR FORMING VIA HOLE AND TRENCH FOR DUAL DAMASCENE INTERCONNECTION

(75) Inventor: Yong-Jun Choi, Seongnam (KR)

(73) Assignee: Dongbu Electronics Co., Ltd., Seoul (KR)

( * ) Notice: Subject to any disclaimer, the term of this patent is extended or adjusted under 35 U.S.C. 154(b) by 304 days.

(21) Appl. No.: 11/024,685

(22) Filed: Dec. 30, 2004

(65) Prior Publication Data

US 2005/0158987 A1    Jul. 21, 2005

(30) Foreign Application Priority Data

Dec. 31, 2003    (KR)    ............... 10-2003-0101800
Dec. 31, 2003    (KR)    ............... 10-2003-0101801

(51) Int. Cl.
*H01L 21/302* (2006.01)

(52) U.S. Cl. ............... 438/706; 438/700; 438/723

(58) Field of Classification Search ............ 438/700, 438/704, 706, 710, 712, 714, 723, 724, 725
See application file for complete search history.

(56) References Cited

U.S. PATENT DOCUMENTS

| | | | |
|---|---|---|---|
| 5,618,751 A | * | 4/1997 | Golden et al. ............. 438/392 |
| 5,976,770 A | * | 11/1999 | Sinta et al. ............. 430/325 |
| 6,706,461 B1 | * | 3/2004 | Sinta et al. ............. 430/270.1 |
| 6,960,818 B1 | * | 11/2005 | Rengarajan et al. ...... 257/510 |
| 7,109,119 B2 | * | 9/2006 | Bao et al. ............. 438/700 |
| 2005/0191840 A1 | * | 9/2005 | Ho et al. ............. 438/618 |

FOREIGN PATENT DOCUMENTS

KR    10-2003-0055802 A    4/2003

* cited by examiner

*Primary Examiner*—Kin-Chan Chen
(74) *Attorney, Agent, or Firm*—Finnegan, Henderson, Farabow, Garrett & Dunner, L.L.P.

(57) ABSTRACT

A method for forming a via hole and a trench for a dual damascene interconnection comprises forming a via hole through an inter-metal insulating film to expose a portion of a surface of an etch stop film on a lower metal film, forming a photoresist film on an entire surface of the resultant structure and in the via hole, exposing a top surface and a side surface of the inter-metal insulating film by recessing the photoresist film using a development process for the photoresist film, forming a bottom antireflective coating film on the exposed surfaces of the inter-metal insulating film and the photoresist film, forming a mask pattern on the bottom antireflective coating film, forming a trench by an etching process using the mask pattern as an etch mask, and completely removing the photoresist film within the via hole.

13 Claims, 11 Drawing Sheets

METHOD FOR FORMING VIA HOLE AND TRENCH FOR DUAL DAMASCENE INTERCONNECTION

CLAIM OF PRIORITY

This application makes reference to, incorporates the same herein, and claims all benefits accruing under 35 U.S.C. §119 from two applications for METHOD FOR FABRICATING THE VIA HOLE AND TRENCH FOR DUAL DAMASCENE INTERCONNECTION filed in the Korean Industrial Property Office on Dec. 31, 2003 and assigned Ser. Nos. 10-2003-0101800 and 10-2003-0101801.

BACKGROUND (a) Technical Field

The present invention relates to a method for forming a metal interconnection of a semiconductor device, and more particularly to a method for forming a via hole and a trench for a dual damascene interconnection.

(b) Description of Related Art

The introduction of a copper interconnection having an electrical characteristic superior to aluminum (Al) or tungsten (W) has resulted in the use of a dual damascene process for overcoming the difficulty in dry etching copper. In the dual damascene process, a via hole and a trench are first formed, the via hole and the trench are filled with a copper film, and then a planarization process is performed.

Figure 1A:
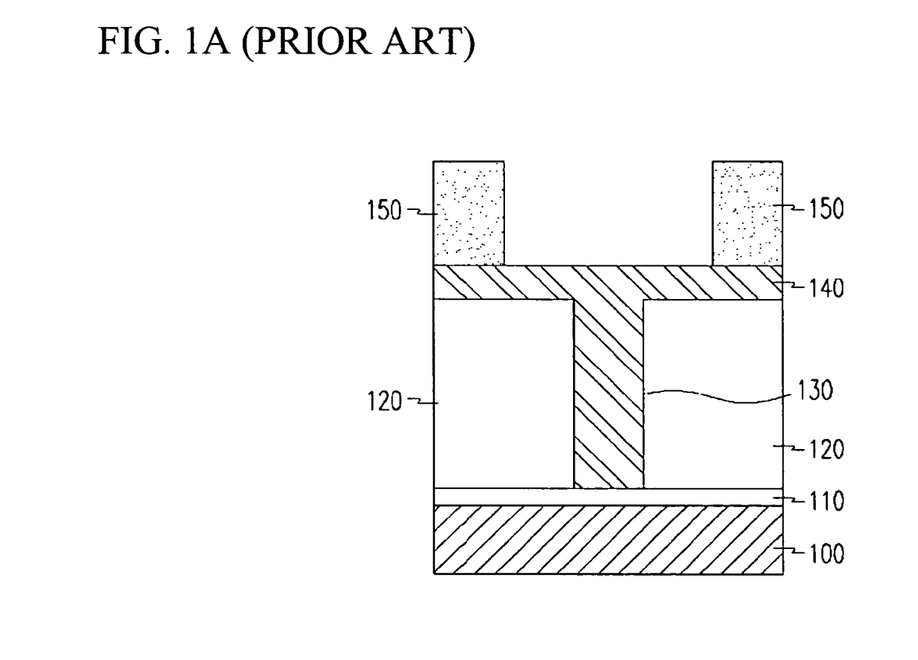
FIGS. 1A and 1B are sectional views illustrating an example of a method for forming a via hole and a trench for a conventional dual damascene interconnection.
Figure 1B:
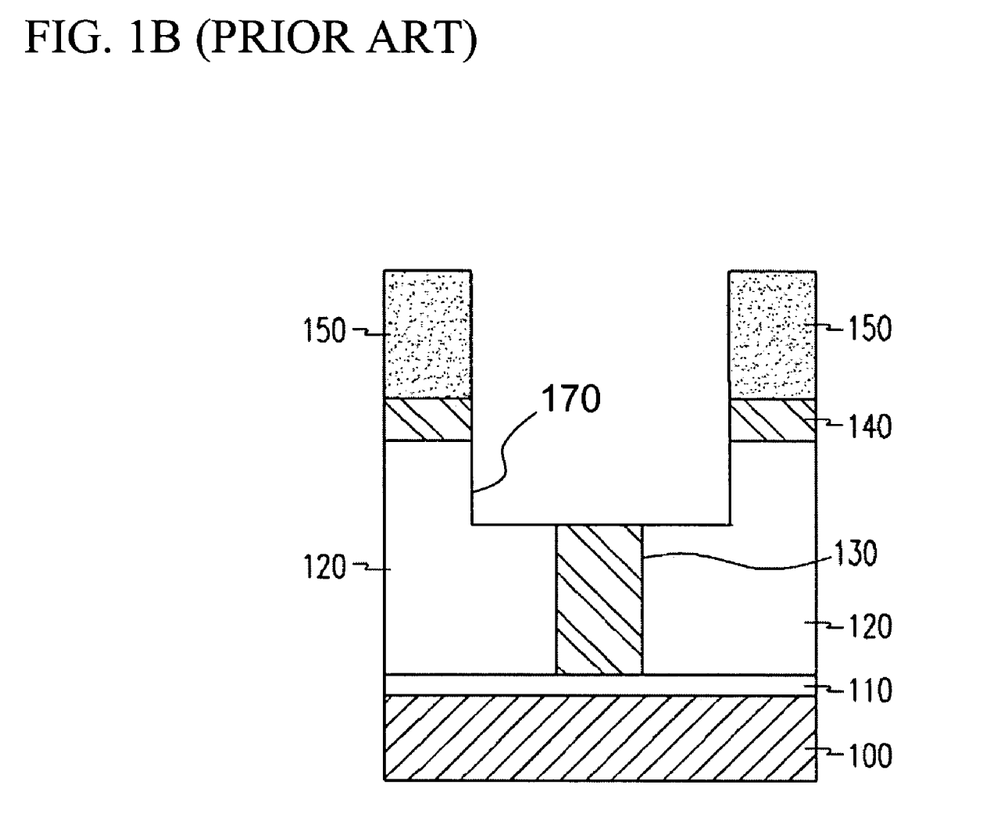
Figure 2:
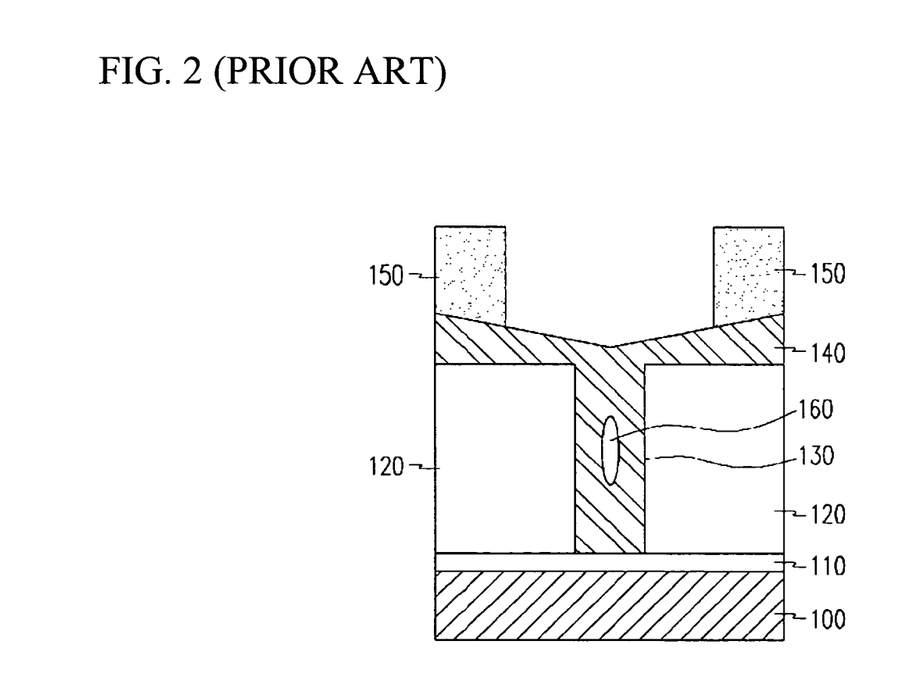
FIGS. 2 and 3 are sectional views illustrating problems of the method illustrated in FIGS. 1A and 1B.
Figure 3:
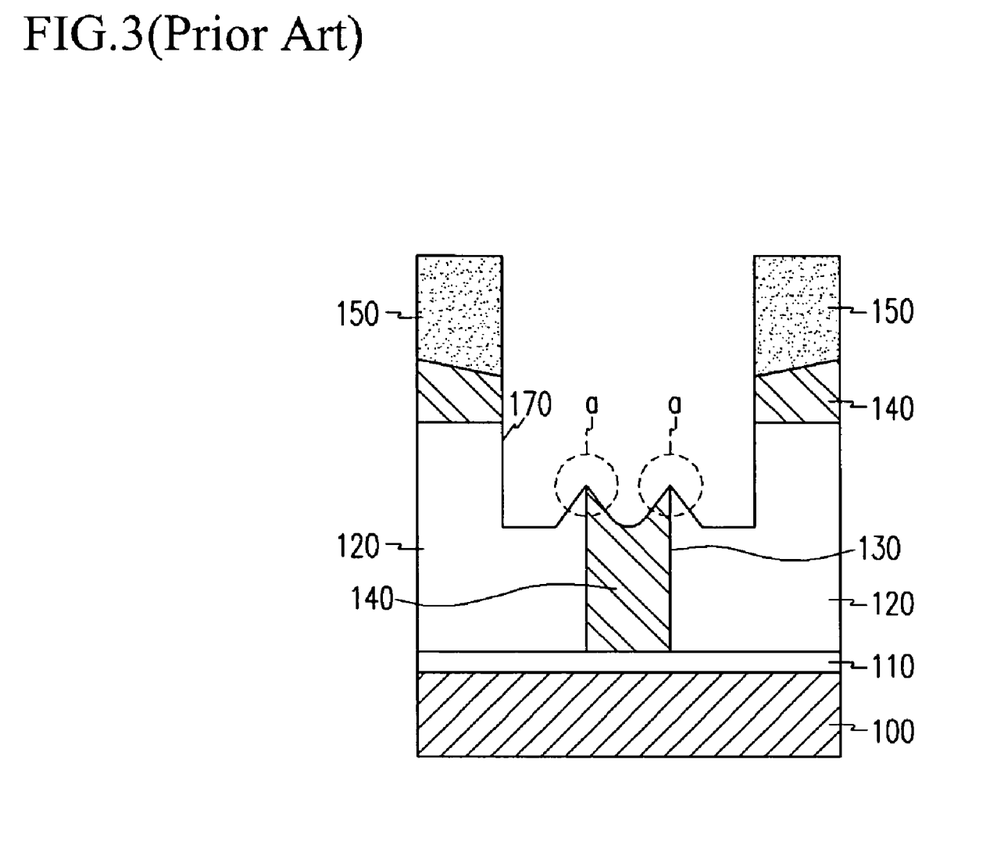

FIGS. 1A and 1B are sectional views illustrating a method for forming a via hole and a trench for a conventional dual damascene interconnection. FIGS. 2 and 3 are sectional views illustrating problems of the method illustrated in FIGS. 1A and 1B.

Referring to FIG. 1A, first, an etch stop film 110 and an inter-metal insulating film 120 are sequentially formed on a lower metal film 100. Subsequently, a via hole 130 is formed by performing an etching process using a mask pattern for via hole formation. Next, a bottom antireflective coating (BARC) film 140 is formed on an entire surface in such a manner that via hole 130 is completely filled with BARC film 140. Then a mask pattern 150 for trench formation is formed on BARC film 140.

Next, as shown in FIG. 1B, exposed portions of BRAC film 140 and inter-metal insulating film 120 are etched up to a certain depth to form a trench 170 by performing an etching process using mask pattern 150 for trench formation as an etch mask.

As shown in FIG. 2, however, BARC film 140 has poor flatness due to via hole 130, which may result in misalignment in a subsequent photolithography process. In addition, a void 160 may be generated within via hole 130. In this case, the etching process for forming trench 170 can generate a fence, as denoted by reference numeral "a."

Figure 4:
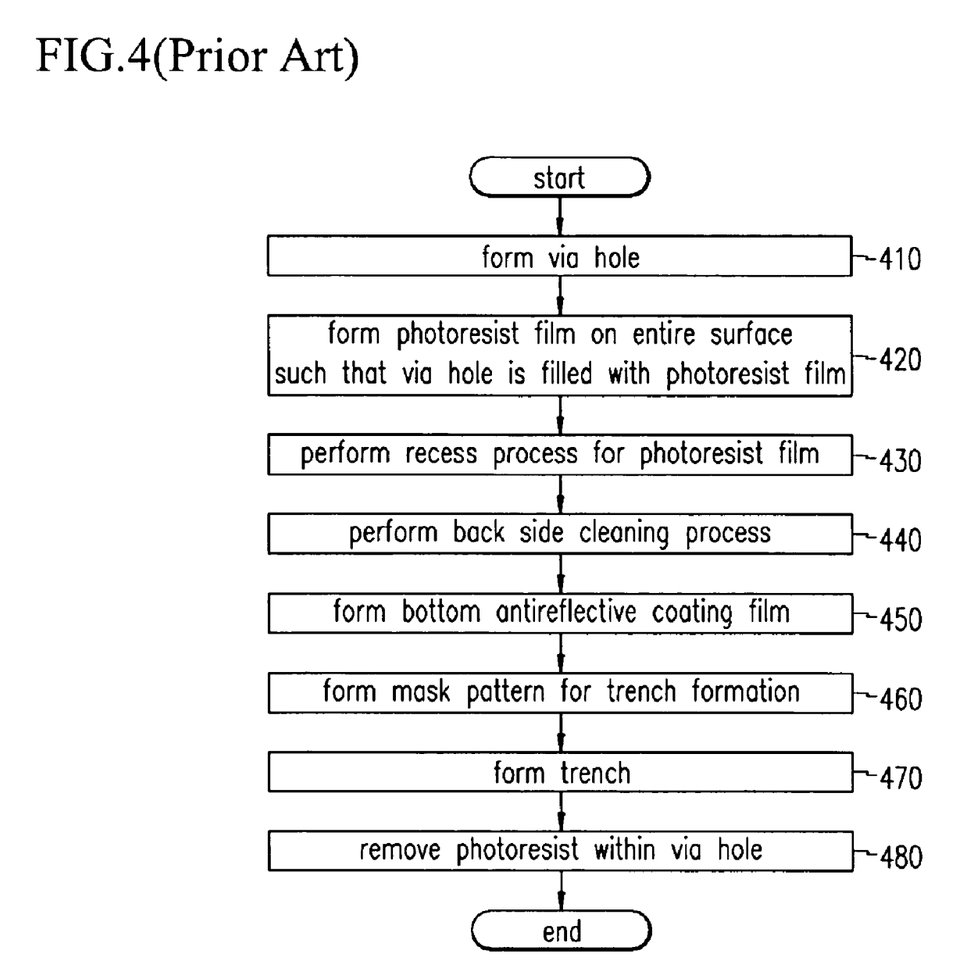
FIG. 4 is a flow chart illustrating an example of a method for forming a via hole and a trench for another conventional dual damascene interconnection for overcoming the problem illustrated in FIGS. 2 and 3.
Figure 5:
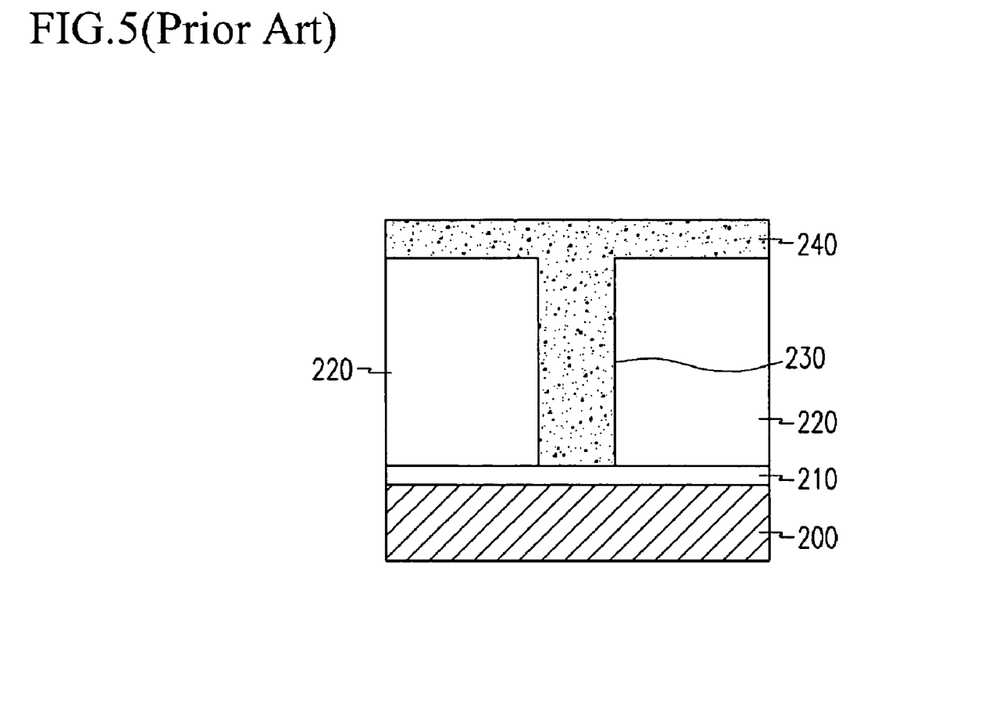
FIGS. 5 to 7 are sectional views illustrating steps in FIG. 4.
Figure 6:
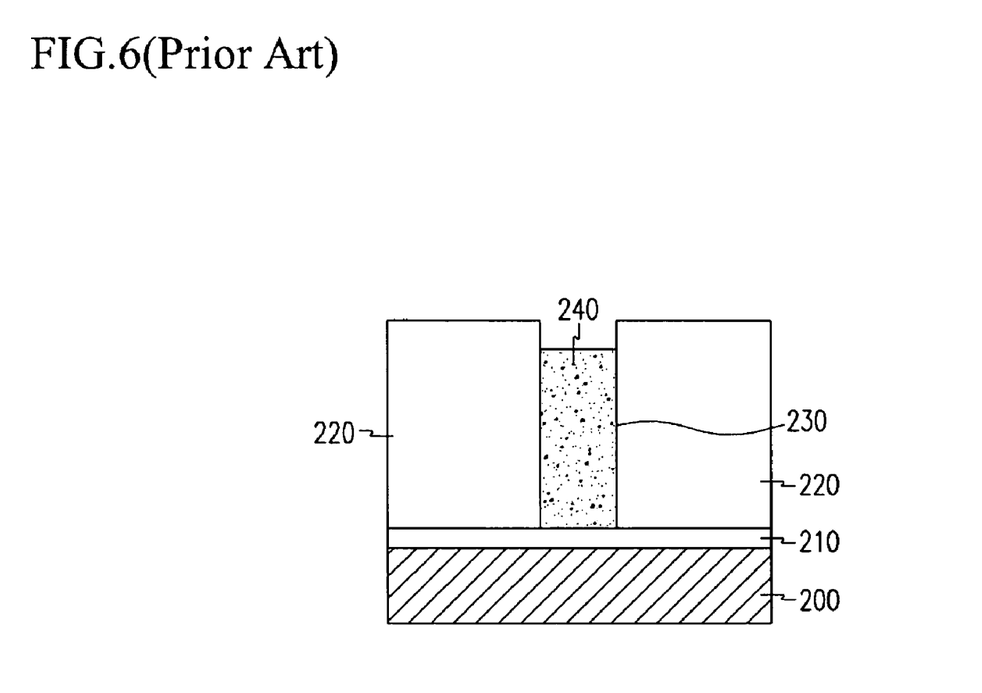
Figure 7:
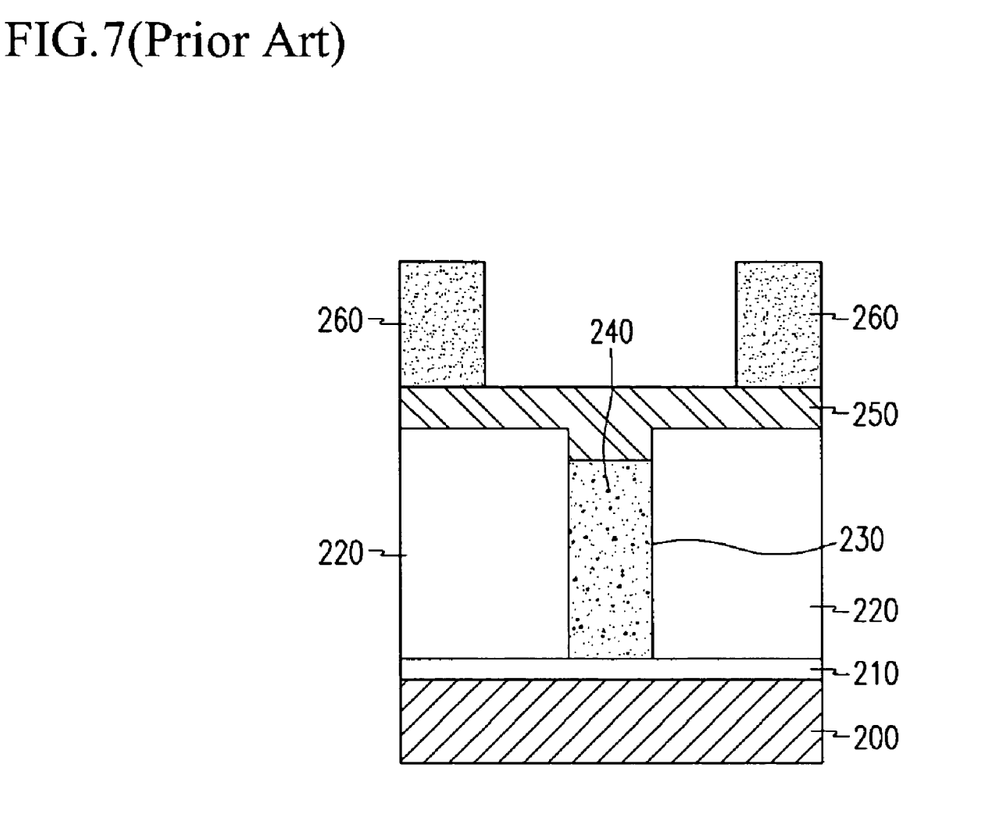

FIG. 4 is a flow chart illustrating an example of a method for forming a via hole and a trench for another conventional dual damascene interconnection for overcoming the above problem. FIGS. 5 to 7 are sectional views illustrating steps in FIG. 4.

Referring to FIGS. 4 and 5, after an etch stop film 210 and an inter-metal insulating film 220 are sequentially formed on a lower metal film 200, a via hole 230 is formed in inter-metal insulating film 220, exposing a portion of a surface of etch stop film 210. (Step 410.) Next, a photoresist film 240 is formed on an entire surface and filled in via hole 130 (Step 420). Next, as shown in FIG. 6, a recess process for photoresist film 240 is performed. (Step 430.)

Subsequently, as shown in FIG. 7, after a back side cleaning process is performed (Step 440), a BARC film 250 is formed on an entire surface (Step 450). In addition, a mask pattern 260 for trench formation is formed on BARC film 250 (Step 460).

Thereafter, at Steps 470 and 480, a trench is formed by performing an etching process using mask pattern 260. Mask pattern 260 for trench formation and BARC film 250 are sequentially removed, as is photoresist film 240 within via hole 230. In addition, the portion of etch stop film 210 exposed through via hole 230 is removed to form a via hole and a trench for a dual damascene interconnection.

A problem with the method described above in FIGS. 4-7 is that semiconductor device fabrication apparatuses must be used alternately in order to perform the above conventional method. More specifically, Steps 410 and 420 must be performed in a photography apparatus, Step 430 must be performed in an asher apparatus, Step 440 must be performed in a cleaning chamber, and Steps 470 and 480 must be performed in the photography apparatus again.

Accordingly, the conventional method has poor efficiency due to a long process time. Particularly, surface roughness in the ashing process is increased and there are detects due to remaining polymer.

SUMMARY OF THE INVENTION

A method for forming a via hole and a trench for a dual damascene interconnection, comprises: forming a via hole through an inter-metal insulating film to expose a portion of a surface of an etch stop film on a lower metal film; forming a photoresist film on an entire surface of the resultant structure and in the via hole is filled with the photoresist film; exposing a top surface and a side surface of the inter-metal insulating film by recessing the photoresist film using a development process for the photoresist film; forming a bottom antireflective coating film on the exposed surfaces of the inter-metal insulating film and the photoresist film; forming a mask pattern on the bottom antireflective coating film; forming a trench by an etching process using the mask pattern as an etch mask; and completely removing the photoresist film within the via hole.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Systems and methods consistent with the present invention will now be described in detail with reference to the accompanying drawings. The following examples may be modified but do not limit the invention, which is set forth in the accompanying claims.

Figure 8:
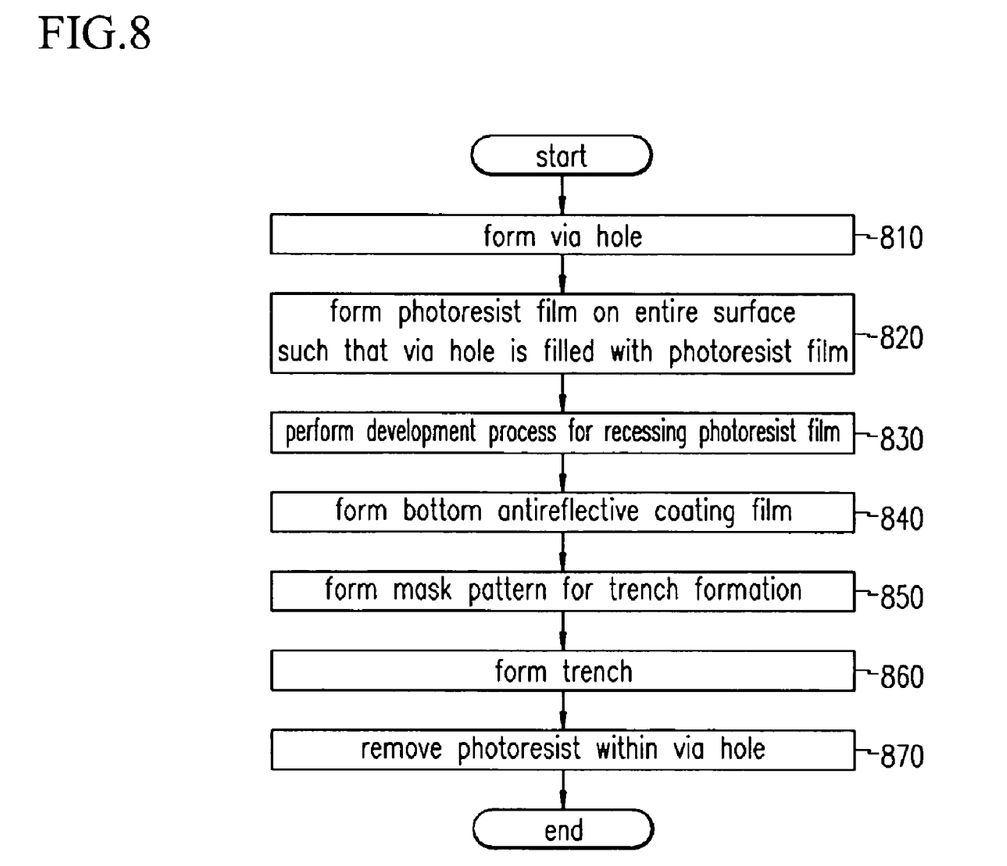
FIG. 8 is a flow chart illustrating a method for forming a via hole and a trench for a dual damascene interconnection consistent with the present invention.

FIG. 8 is a flow chart illustrating a method for forming a via hole and a trench for a dual damascene interconnection consistent with an embodiment of the present invention. FIGS. 9 to 13 are sectional views illustrating the method of FIG. 8.

Figure 9:
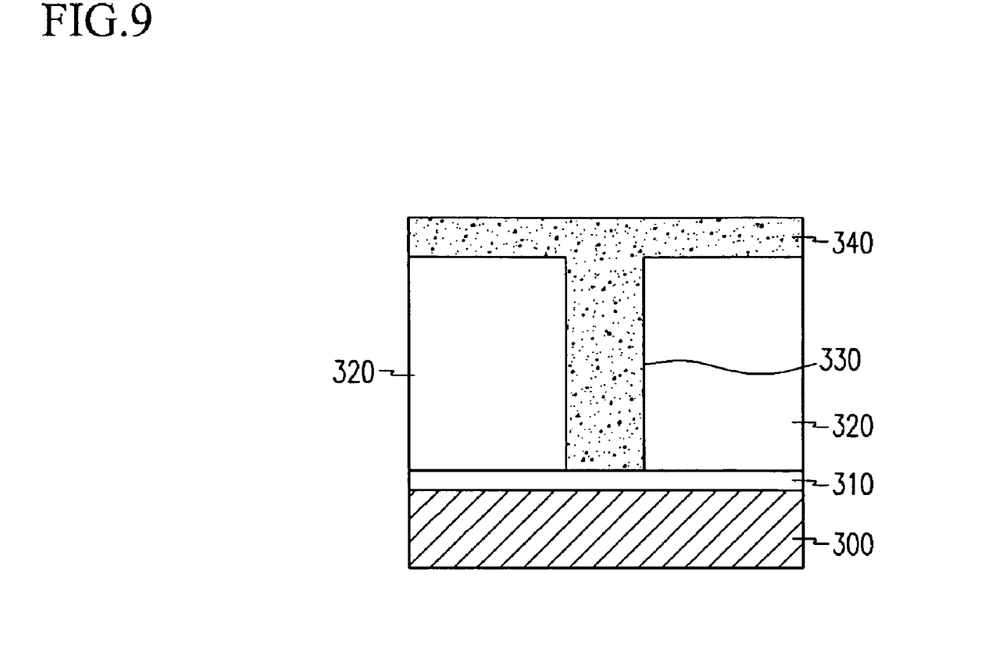
FIGS. 9 to 13 are sectional views illustrating steps in FIG. 8.

Referring to FIGS. 8 and 9, after an etch stop film 310 and an inter-metal insulating film 320 are sequentially formed on a lower metal film 300, a via hole 330 through inter-metal insulating film 320 is formed, exposing a portion of a surface of etch stop film 310. (Step 810.)

Etch stop film 310 may comprise silicon nitride. A mask pattern (not shown) may be formed on inter-metal insulating film 320 for forming via hole 330. Via hole 330 is formed by performing an etching process using the mask pattern. After forming via hole 330, the mask pattern is removed.

Subsequently, a photoresist film 340 is formed on an entire surface such that via hole 330 is filled with photoresist 340 (Step 820). Photoresist film 340 is formed with an ArF (having a wavelength of 193 nm), a KrF (having a wavelength of 248 nm) or an I-line (having a wavelength of 365 nm) light source and may have a dissolution rate of 0.1 to 10000 Å. When an ArF or KrF light source is used, a protection group of resin may be used to adjust the dissolution rate of photoresist film 340. When an I-line light source is used, the dissolution rate of photoresist film 340 may be adjusted using an amount of Novolak resin and photo acid compound (PAC).

Figure 10:
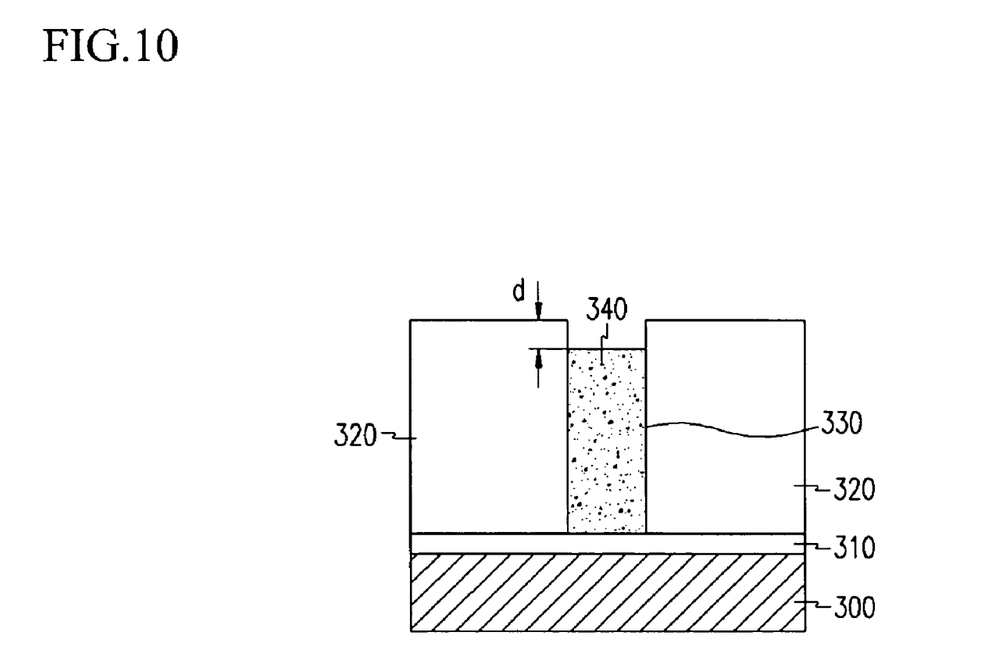

Next, as shown in FIG. 10, a top surface and a side surface of inter-metal insulating film 320 is exposed by recessing photoresist film 340 using a development process (Step 830). The development process for photoresist film 340 can be performed using a basic solution having a concentration of 0.0001 to 100 N. The basic solution may contain tetramethyl ammonium hydroxide (TMAH) or KOH.

A recess depth d of photoresist film 340 from a surface of inter-metal insulating film 320 as shown in FIG. 10 may have a maximum value of 90000 Å. The recess depth d can be adjusted by controlling the dissolution rate of photoresist film 340. After performing the development process for photoresist film 340, a rinse process using DI water is performed.

Figure 11:
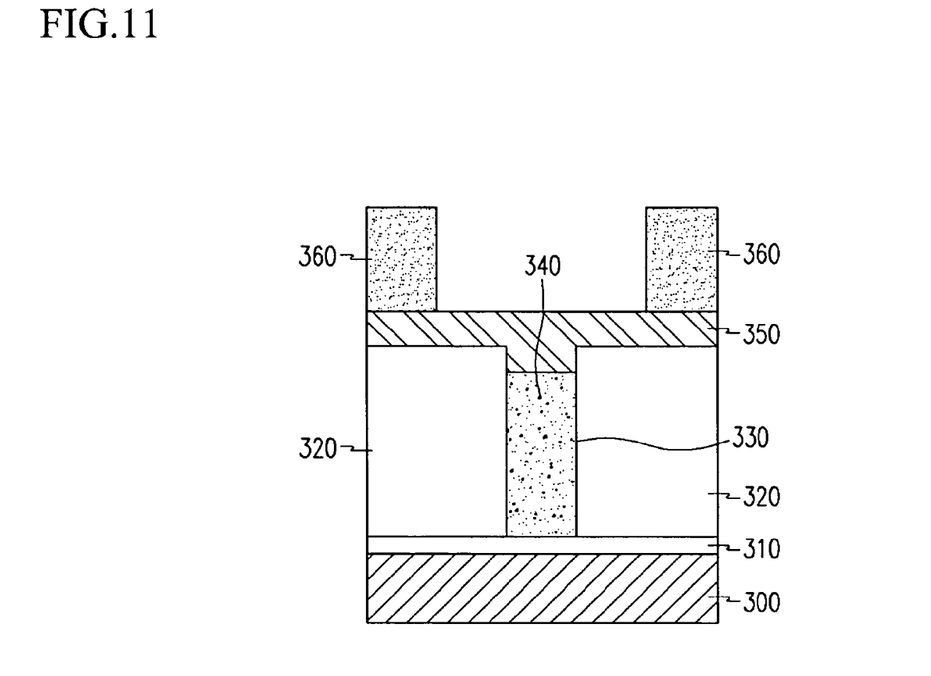

Next, as shown in FIG. 11, a bottom antireflective coating (BARC) film 350 is formed on the exposed surfaces of inter-metal insulating film 320 and photoresist film 340 (Step 840). Next, a mask pattern 360 for trench formation is formed on BARC film 350 (Step 850).

Figure 12:
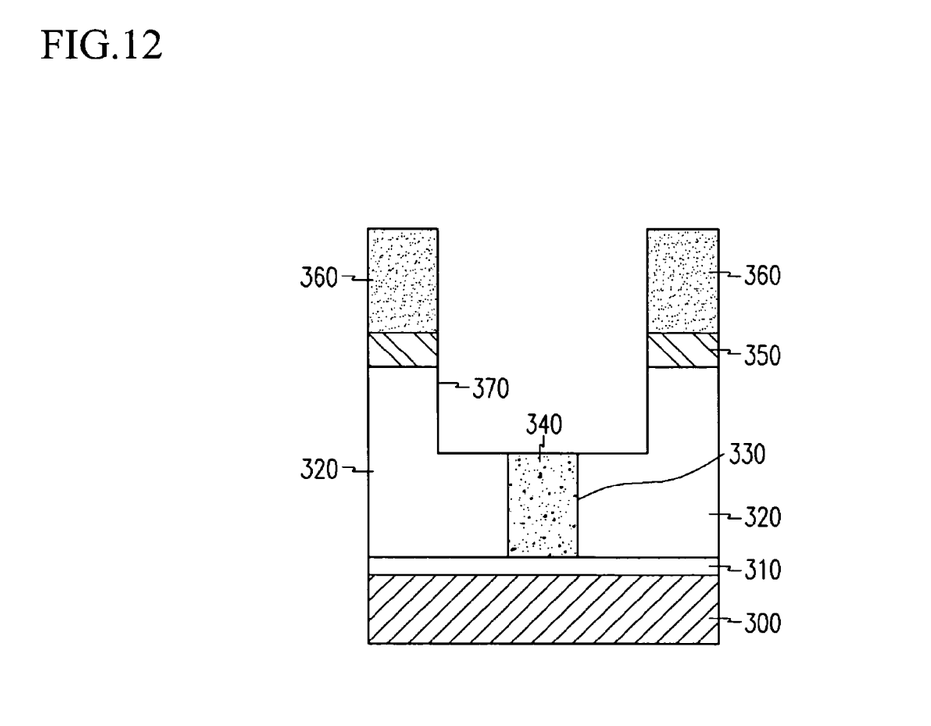

Subsequently, as shown in FIG. 12, a trench 370 is formed by performing an etching process using mask pattern 360 as an etch mask (Step 860). Trench 370 is wider than via hole 330.

Figure 13:
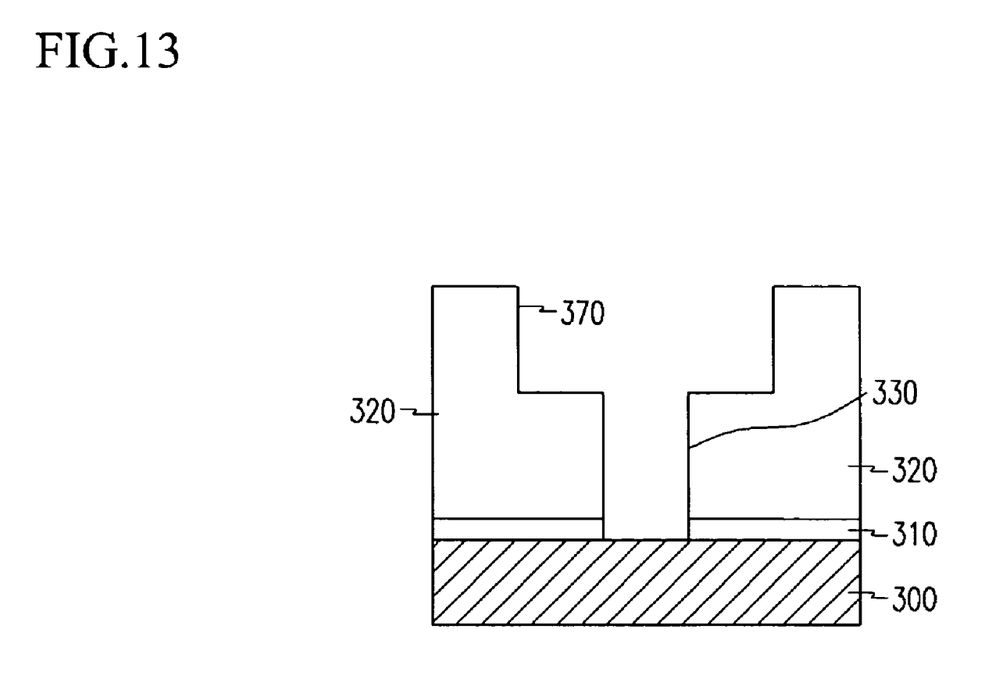

Next, as shown in FIG. 13, photoresist film 340 within via hole 330 is removed (Step 870). Mask pattern 360 is also removed simultaneously. Thereafter, BARC film 350 and a portion of etch stop film 310 exposed through via hole 330 are removed (not shown).

Consistent with the present invention, the recess process for photoresist film 340 (FIG. 10 and Step 830) is performed in a photolithography apparatus using the development process for the photoresist film. Consequently, a back side cleaning process is unnecessary and all processes can be performed in a single photolithography apparatus without the need to perform processes in several apparatuses alternately. In addition, defects can be further suppressed by performing the rinse process using DI water after performing the recess process.

Figure 14:
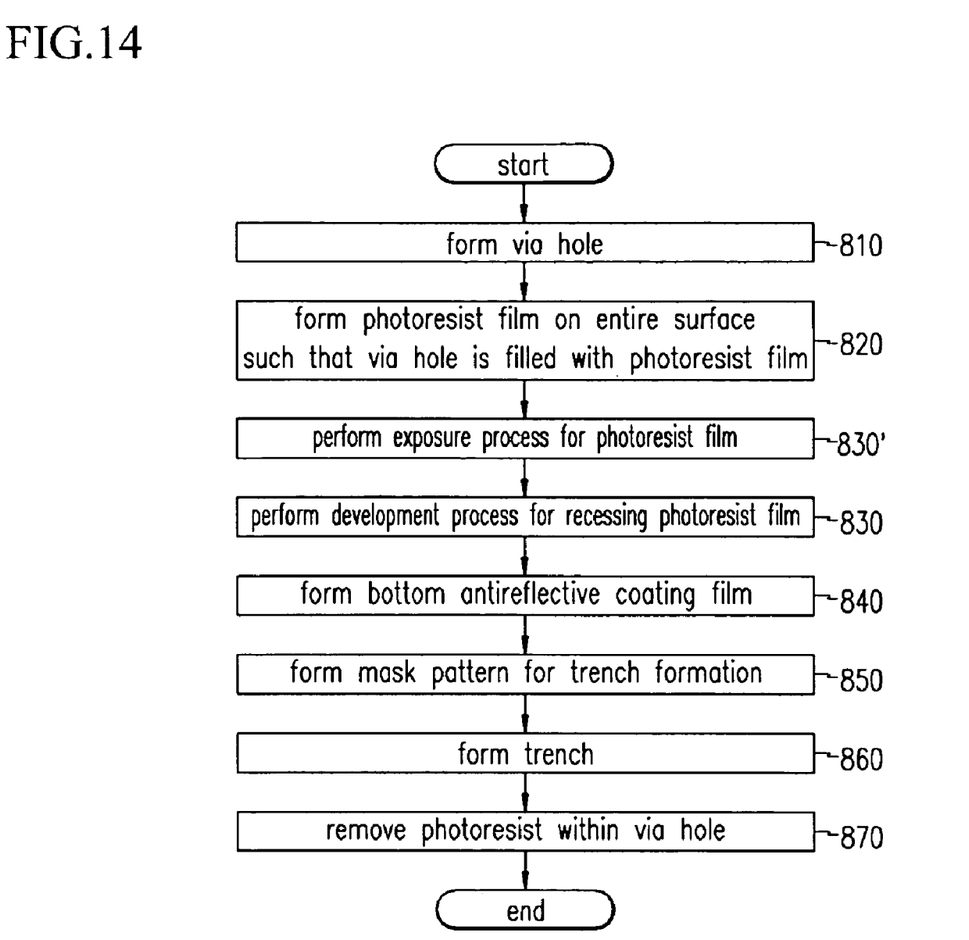
FIG. 14 is a flow chart illustrating another method for forming a via hole and a trench for a dual damascene interconnection consistent with the present invention.

FIG. 14 is a flow chart illustrating a method for forming a via hole and a trench for a dual damascene interconnection consistent with another embodiment of the present invention.

As compared to the method of FIG. 8, the method of FIG. 14 further includes performing an exposure process for photoresist film 340 (Step 830') prior to the development process at Step 830. The exposure process for photoresist film 340 can be performed using a stepper or a scanner employing an I-line light source having a wavelength of 365 nm. The exposure process for photoresist film 340 need not use a reticle, and an entire surface of photoresist film 340 may be exposed.

The recess depth d of photoresist film 340 may be easily adjusted by controlling the amount of exposure in the exposure process at Step 830' and the development time in the process at Step 830.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a via hole and a trench for a dual damascene interconnection, comprising:

forming a via hole through an inter-metal insulating film to expose a portion of a surface of an etch stop film on a lower metal film;

forming a photoresist film on an entire surface of the resultant structure and in the via hole;

exposing a top surface and a side surface of the inter-metal insulating film by recessing the photoresist film using a development process for the photoresist film;

forming a bottom antireflective coating film on the exposed surfaces of the inter-metal insulating film and the photoresist film;

forming a mask pattern on the bottom antireflective coating film;

forming a trench by an etching process using the mask pattern as an etch mask; and simultaneously removing the photoresist film in the via hole and the mask pattern on the bottom antireflective coating film.

2. The method of claim 1, wherein the photoresist film is formed with an ArF, a KrF, or an I-line light source.

3. The method of claim 2, wherein forming the photoresist film includes forming the photoresist film to have a dissolution rate of 0.1 to 10000 Å.

4. The method of claim 3, wherein forming the photoresist film includes adjusting the dissolution rate of the photoresist film using a protection group of resin.

5. The method of claim 3, wherein forming the photoresist film includes adjusting the dissolution rate of the photoresist film using an amount of Novolak resin and photo acid compound (PAC).

6. The method of claim 1, wherein recessing the photoresist film includes performing the development using a basic solution having a concentration of 0.0001 to 100 N.

7. The method of claim 6, wherein the basic solution contains tetramethyl ammonium hydroxide (TMAH) or KOH.

8. The method of claim 6, wherein a maximum value of a recess depth of the photoresist film is 90000 Å.

9. The method of claim 1, further comprising performing a rinse process using DI water after performing the development process for the photoresist film.

10. A method for forming a via hole and a trench for a dual damascene interconnection, comprising:
   forming a via hole through an inter-metal insulating film to expose a portion of a surface of an etch stop film on a lower metal film;
   forming a photoresist film on an entire surface of the resultant structure and in the via hole;
   performing an exposure process for the photoresist film;
   exposing a top surface and a side surface of the inter-metal insulating film by recessing the exposed photoresist film using a development process for the photoresist film;
   forming a bottom antireflective coating film on the exposed surfaces of the inter-metal insulating film and the photoresist film;
   forming a mask pattern on the bottom antireflective coating film;
   forming a trench by an etching process using the mask pattern as an etch mask; and
   simultaneously removing the photoresist film within the via hole and the mask pattern on the bottom antireflective coating film.

11. The method of claim 10, wherein performing the exposure process for the photoresist film includes using a stepper or a scanner having an I-line light source.

12. The method of claim 10, wherein performing the exposure process for the photoresist film includes exposing an entire surface and does not use a reticle.

13. The method of claim 10, further including adjusting a recess depth of the photoresist film by controlling an amount of exposure in the exposure process and a development time.

* * * * *